United States Patent
Skotnicki et al.

(10) Patent No.: US 6,495,403 B1
(45) Date of Patent: Dec. 17, 2002

(54) GATE-ALL-AROUND SEMICONDUCTOR DEVICE AND PROCESS FOR FABRICATING THE SAME

(75) Inventors: Thomas Skotnicki, Crolles Montfort (FR); Malgorzata Jurczak, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 43 days.

(21) Appl. No.: 09/680,035

(22) Filed: Oct. 5, 2000

(30) Foreign Application Priority Data

Oct. 5, 1999 (FR) .............................................. 99 12406

(51) Int. Cl.[7] .............................................. H01L 21/84
(52) U.S. Cl. ....................... 438/157; 438/745; 438/587; 257/63; 257/65
(58) Field of Search ........................... 257/63, 65, 756, 257/754; 438/696, 745, 587, 595, 157

(56) References Cited

U.S. PATENT DOCUMENTS

| | | |
|---|---|---|
| 5,188,973 A | 2/1993 | Omura et al. |
| 5,578,513 A | 11/1996 | Maegawa |
| 5,583,362 A | 12/1996 | Maegawa |
| 5,801,397 A | 9/1998 | Cunningham |

FOREIGN PATENT DOCUMENTS

| | | |
|---|---|---|
| DE | 198 03 479 | 12/1998 |

OTHER PUBLICATIONS

Mamoru Terauchi, Naoyuki Shigyo, Akihiro Nitayama, and Fumio Horiguchi, " Depletion Isolation Effect of Surrounding Gate Transistors," IEEE Trans. Electr. Devices, vol. 44, No. 12, (1997) pp. 2303–2305.*

Hon–Sum Philip Wong, Kevin K. Chan, and Yuan Taur, "Self–Aligned (Top and Bottom) Double–Gate MOSFET with a 25 nm Thick Silicon Channel," Proc. IEDM (1997) pp. 427–430.*

Clement II Wann, Kenji Noda, Tetsu Tanaka, Makota Yoshida, and Chenming Hu, "A Comparative Study of Advanced MOSFET Concepts," IEEE Trans. Electr. Devices, vol. 43, No. 10, (1996) pp. 1742–1753.*

James A. Hutchby, George I. Bourianoff, Victor V. Zhirnov, and Joe E. Brewer, "Extending the Road Beyond CMOS," IEEE Circuits and Devices Magazine, Mar., 2002, pp 28–41.*

Preliminary Search Report dated Apr. 28, 2000 for French Patent Application No. 99 12406.

* cited by examiner

*Primary Examiner*—Tom Thomas
*Assistant Examiner*—Thomas Magee
(74) *Attorney, Agent, or Firm*—Lisa K. Jorgenson; Stephen Bongini; Fleit, Kain, Gibbons, Gutman & Bongini P.L.

(57) ABSTRACT

A method is provided for fabricating a semiconductor device having a gate-all-around architecture. A substrate is produced so as to include an active central region with an active main surface surrounded by an insulating peripheral region with an insulating main surface. The active main surface and the insulating main surface are coextensive and constitute a main surface of the substrate. A fist layer of Ge or an SiGe alloy is formed on the active main surface, and a silicon layer is formed on the first layer and on the insulating main surface. The silicon layer and the first layer are masked and etched in order to form a stack on the active main surface, and the first layer is removed so that the silicon layer of the stack forms a bridge structure over the active main surface. The bridge structure defines a tunnel with a corresponding part of the active main surface. A thin layer of a dielectric material that does not fill the tunnel is formed on the external and internal surfaces of the bridge structure and on the side walls. A conducting material is deposited so as to cover the bridge structure and fill the tunnel, and the conducting material is masked and etched in order to form a gate-all-around region for the semiconductor device. Also provided is a semiconductor device having a gate-all-around architecture.

10 Claims, 3 Drawing Sheets

GATE-ALL-AROUND SEMICONDUCTOR DEVICE AND PROCESS FOR FABRICATING THE SAME

CROSS-REFERENCE TO RELATED APPLICATIONS

This application is based upon and claims priority from prior French Patent Application No. 99-12406, filed Oct. 5, 1999, the entire disclosure of which is herein incorporated by reference.

BACKGROUND OF THE INVENTION

1. Field of the Invention

The present invention relates to electronic devices, and more specifically to a semiconductor device such as a transistor that has a gate-all-around (GAA) gate architecture.

2. Description of Related Art

Semiconductor devices having a "gate-all-around" (GAA) gate architecture are particularly desired because of GAA's extraordinary properties in terms of performance and the suppression of short-channel effects. These advantageous properties are due to the fact that in GAA architecture the thin silicon film constituting the channel of the device is surrounded by the gate and is exclusively controlled by the gate. Thus, the influence of the drain field is removed so the short-channel effects are eliminated. The volume inversion in the silicon film, or at least the effect of two parallel channels in thicker films, results in a very significant gain in performance for a given silicon area.

Such a GAA gate architecture is described in documents such as "A new scaling methodology for the 0.1–0.025 $\mu$m MOSFET" by C. Fiegna, H. Iwai, T. Wada, T. Saito, E. Sangiorgi, and B. Ricco, Symp. VLSI Techn. Dig., 1993, pages 33–34; "Comparative Study of Advanced MOSFET Concepts," IEEE Trans. Electron Devices, Vol. 43, No. 10, 1996, pages 1742–1753; and "Device Design Considerations for Double-Gate, Ground-Plane and Single-Gated Ultra-Thin SOI MOSFETs at the 25 nm Channel Length Generation," Int, Electron Devices Meet. Tech. Dig., 1998, pages 407–410.

Despite the advantages afforded by the GAA gate architecture, a viable realization of a GAA device has not been achieved at the present time. Vertical GAA architecture structures, such as those described by T. Mizuno et al. (Symposium on VLSI Technology, 1998, pages 23–24) and M. Terauchi et al. (T. Electro Devices, December 1997, pages 2303–2305), come up against technological problems and the limitations imposed by the photolithographic etching steps. To benefit from a GAA architecture, very thin films on the order of 10 nm are required, which in terms of vertical orientation corresponds to the resolution of the photolithographic etching of the gate.

A horizontal orientation GAA structure has also been proposed, but the feasibility and the quality of epitaxy progressing in a tunnel made of dielectric material, as proposed by H-S. P. Wong et al. (UDM Techn. Digest, 1997, pages 427–430), do not appear to be reliable.

SUMMARY OF THE INVENTION

In view of these drawbacks, it is an object of the present invention to overcome the above-mentioned drawbacks and to provide a simple and reliable process for fabricating a semiconductor device (e.g., a transistor) having a GAA gate architecture.

Another object of the present invention is to provide a process for fabricating a semiconductor device having a GAA gate architecture through a succession of simple steps that allow well-controlled, reproducible, and extremely thin (e.g., 1–20 nm) silicon (channel) layers to be produced.

Yet another object of the present invention is to provide a process for fabricating a semiconductor device having a GAA gate architecture in which the need for aggressive photolithography is eliminated.

A further object of the present invention is to provide a process for fabricating a semiconductor device having a GAA gate architecture in which low junction capacitances (junction on insulator) are realized.

Still another object of the present invention is to provide a gate-all-around semiconductor device with a substrate having an active central region made of semiconductor material surrounded by an insulating peripheral region made of dielectric material.

One embodiment of the present invention provides a method for fabricating a semiconductor device having a gate-all-around architecture. According to the method, a substrate is produced so as to include an active central region semiconductor material surrounded by an insulating peripheral region of dielectric material. The central region has an active main surface and the peripheral region has an insulating main surface. Further, the active main surface and the insulating main surface are coextensive and constitute a main surface of the substrate. A first layer of monocrysta)ine Ge or an SiGe alloy is formed on the active main surface, and a silicon layer is formed on the first layer and on the insulating main surface. The silicon layer and the first layer are masked and etched in order to form a stack on the active main surface, and the first layer is removed so that the monocrystalbine silicon layer of the stack forms a bridge structure over the active main surface. The bridge structure has side walls, an external surface, and an internal surface that defining a tunnel with a conesponding part of the active imain surface. A thin layer of a dielectric material that does not fill the tunnel is formed on the external and internal surfaces of the bridge structure and on the side walls. A conducting material is deposited so as to cover the bridge structure and fill the tunnel, and the conducting material is masked and etched in order to form a gate-all-around region for the semiconductor device. In a preferred method, selective epitaxy is used to form the first layer, non-selective epitaxy is used to form the silicon layer, and selective etching is used to remove the first layer.

Another embodiment of the present invention provides a semiconductor device that includes a substrate, a bridge structure on a main surface of the substrate, and a gate region. The substrate includes an active central region of semiconductor material surrounded by an insulating peripheral region of dielectric material, with the central region having an active main surface and the peripheral region having an insulating main surface. The active main surface and the insulating main surface are coextensive and constitute the main surface of the substrate. Further, the bridge structure consists of silicon and has two opposed lateral polycrystalline parts that rest on opposed parts of the insulating peripheral region. The two opposed lateral polycrystalline parts are joined together by a thin central monocrystalline part that is spaced above the active region of the substrate, and the gate region surrounds at least a portion of the thin central part of the bridge structure. In one preferred embodiment, the thickness of the thin central monocrystalline part of the bridge is from 1 to 50 nm, and the thin central monocrystailine part is spaced from the main surface of the active central region of the substrate by a height of from 1 to 50 nm.

Other objects, features, and advantages of the present invention will become apparent from the following detailed description. It should be understood, however, that the detailed deseption and specific examples, while indicating preferred embodiment of the present invention, are given by Way of illustration only and various modifications may naturally be performed without deviating from the present invention.

DETAILED DESCRIPTION OF PREFERRED EMBODIMENTS

Figure 1A:
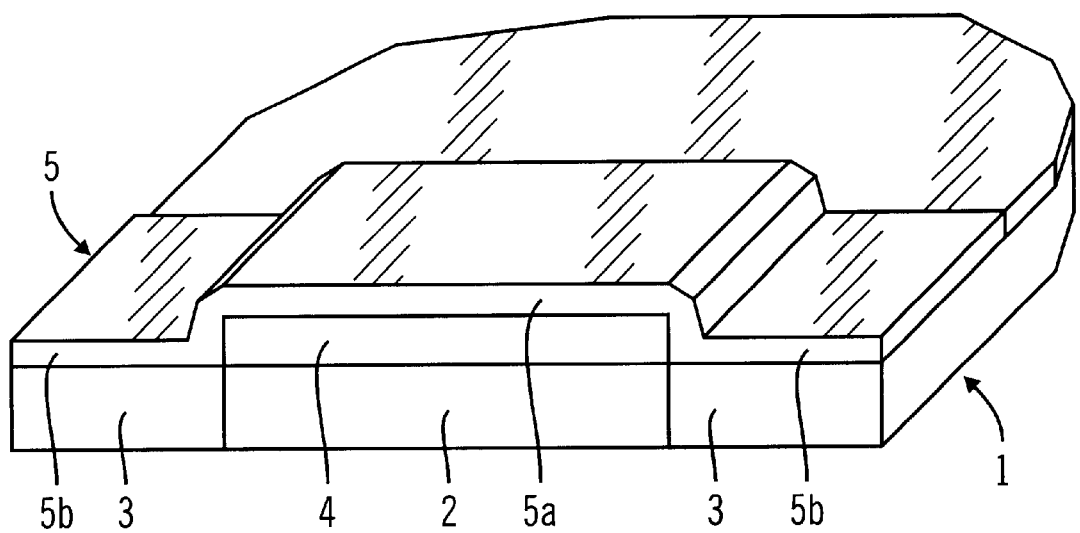
FIGS. 1a through 1e are schematic representations of steps of a process for e fabricating a GAA-type semiconductor device in accordance with one embodiment of the present invention.

Preferred embodiments of the present invention will be described in detail hereinbelow with reference to the attached drawings.

The present invention provides semiconductor devices having a GAA gate architecture. A preferred embodiment of the present invention provides a process for fabricating such a GAA-type semiconductor device. According to this preferred process, a substrate is produced so as to have an active central region made of semiconductor material surrounded by an insulating peripheral region made of dielectric material. The central region has an active main surface and the peripheral region has an insulating main surface, with these two surfaces being coextensive and constituting a main surface of the substrate.

Next, a layer of monocrystalline Ge or an SiGe alloy is formed on the active main surface by selective epitaxy, and a silicon layer is formed on the monocrystalline Ge or SiGe alloy layer and on the insulating main surface by nonselective epitaxy. The layer is monocrystalline in its central part on the Ge or SiGe alloy layer and polycrystalline in its parts on the insulating surface. The silicon layer and the Ge or SiGe alloy layer are then masked and etched in order to form a stack on the active main surface. The stack includes a Ge or SiGe monocrystalline layer and a monocrystalline silicon layer, and has two opposed side walls that reveal the Ge or SiGe alloy layer. Then, the Ge or SiGe alloy layer is removed by selective lateral etching so that the silicon layer of the stack forms a bridge structure over the active main surface.

More specifically, the bridge structure has side walls, an external surface, and an internal surface that define a tunnel with a corresponding part of the active main surface. A thin layer of a dielectric material that does not fill the tunnel is next formed on the external and internal surfaces of the bridge structure as well as on its side walls, and a conducting material is deposited so as to cover the bridge structure and fill the tunnel. The conducting material is masked and etched in order to form a gate region having a GAA architecture of the desired size and geometry. In preferred embodiments, the substrate is silicon.

In this fabrication process, the silicon layer formed on the Ge or SiGe alloy layer can be consecutively n-doped and p-doped in the region that subsequently forms the channel of the semiconductor device, as in conventional fabrication processes. This doping may be carried out in situ daring the non-selective epitaxial growth of the silicon layer or may be carried out after the silicon epitaxial layer has been formed by masking and ion implantation. Further, this silicon layer consists of monocrystalline silicon on the Ge or SiCe alloy layer and polycrystalline silicon on the insulating main surface. Thus, the thickness of this silicon layer on the Ge or SiGe alloy layer may be different from the thickness on the insulating main surface. In particular, the silicon layer may be much thicker on the insulating main surface, and this is beneficial for the series resistances and for siliciding the junctions. In general, this silicon layer has a thickness varying from 1 to 50 nm, and typically has a thickness of about 20 nm.

The formation of the layer of dielectric material on the bridge structure may be achieved through thermal oxidation of the silicon layer or through a conventional deposition of a dielectric material. Any suitable dielectric material can be used, but it is preferable to use $SiO_2$. Such an $SiO_2$ layer is preferably formed by thermal oxidation of the silicon layer.

Many well-known alloys can be used for the SiGe alloy layer, such as $Si_{1-x}Ge_x$ alloys where $0<x<1$ and $Si_{1-x-y}Ge_xC_y$ alloys where $0<x<0.95$ and $0<y\leq0.05$. Preferably, an SiGe alloy having a Ge content such that $x\geq0.05$ (and more preferably $0.20\leq x\leq0.30$) is used, because the selectivity of the etching compared to the Si increases with increasing Ge content in the alloy. Furthermore, the Ge and SiGe alloys can easily be selectively removed, either by oxidizing chemistry (such as by etching with a solution containing 40 ml of 70% $HNO_3$+20 ml of $H_2O_2$+5 ml of 0.5% HF) or by isotropic plasma etching. In general, the Ge or SiGe alloy layer has a thickness that can vary from a few nanometers to 50 nm, and is generally about 20 nm.

The conducting material deposited over the bridge structure can be a metal, but polycrystalline silicon is preferred. In the case of silicon, the silicon is preferably doped in situ. The conducting material is etched in order to form the GAA-type gate using any conventional gate photolithography process. Additionally, residues of the material inside the tunnel are not a problem during operation of the device, except for a slight increase in the gate-drain and gate-source overlap capacitances. However, these parasitic capacitances may be reduced by using strict design rules for the distance between the gate and insulation edge. Further, the implantation of the source and drain regions, which is optionally preceded by the formation of spacers and extensions (LDD), can be camed out in a conventional manner and can be followed by a conventional activation annealing step and a siliciding step.

The layer of silicon above the tunnel has a perfect monocrystalline structure and uniform thickness. The defects that appear in the silicon layer at the edge of the insulating peripheral region (i.e., the transition from monocrystalline Si to polycrystalline Si) have no influence on the channel of the device. This is because they are cut away on two opposed side walls by the etching of the layer, and on the other two sides they are located within the source/drain junctions away from the channel. Additionally, the fact that the SiGe alloy is removed just after its formation and the photoetching step, without any thermal step between the two, favors stability and allows greater thicknesses. This gives greater freedom for subsequent thermal steps, because there is no longer a risk of the Sire alloy layer relaxing.

Another preferred embodiment of the present invention provides a gate-all-around semiconductor device with a substrate having an active central region made of semiconductor material surrounded by an insulating peripheral region made of dielectric material. The central region has an active main surface and the peripheral region has an insulating main surface, with these two surfaces being coextensive and constituting a main surface of the substrate. The semiconductor device also has a bridge stricture on the main surface of the substrate. The bridge structure consists of silicon and has two opposed lateral parts of polycrystalline silicon that rest on opposed parts of the insulating peripheral region and constitute source and drain regions. The two opposed lateral parts are joined together by a thin central part of monocrystalline silicon spaced above the active region of the substrate to constitute a channel region of the device. Additionally, a gate region surrounds the thin central part of the bridge structure.

The thin central part is made of monocrystalline silicon and has a thickness that varies from 1 to 50 nm. It is spaced from the main surface of the active central region by a height that is generally about 1 to 50 nm. Furthermore, the source and drain contacts are formed on the lateral parts of the bridge structure above the opposed parts of the insulating peripheral region. The gate region is extended as far as the insulating peripheral region and the gate contact is also formed above the insulating peripheral region. Preferably, the semiconductor device is a transistor such as a MOSFET transistor.

FIGS. 1a through 1e illustrate in more detail a process for fabricating a GAA-type semiconductor device in accordance with one exemplary embodiment of the present invention. As shown in FIG. 1a, a layer 4 of a monocrystalline SiGe alloy is first deposited upt to a thickness that varies from 1 to 50 nm by selective epitaxy on a main surface of a silicon active central region 2 of a substrate 1. The active central region 2 of the substrate 1 is surrounded by an insulating peripheral region 3. The SiGe alloy layer 4 and the main surface of the insulating peripheral region are covered with a silicon layer 5 by non-selective epitaxy which forms an extremely thin bridge structure of between 1 to 50 nm, and preferably 1 to 20 nm. Said layer is monocrystalline in its central part 5a an the active zone (this part will subsequently constitute the channel of the transistor) and is polycrystalline in its part deposited on the insulating surface (these parts will subsequently constitute the regions of source and drain). The silicon layer 5 is then doped in a conventional manner (e.g., by masking and ion implantation) in the region that will subsequently constitute the channel of the transistor.

Figure 1B:
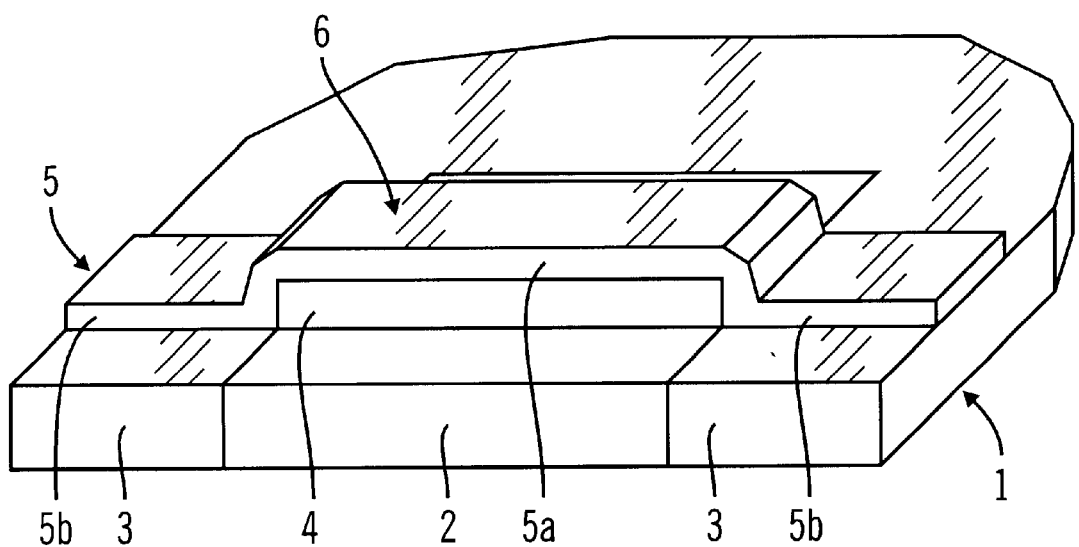
Figure 1C:
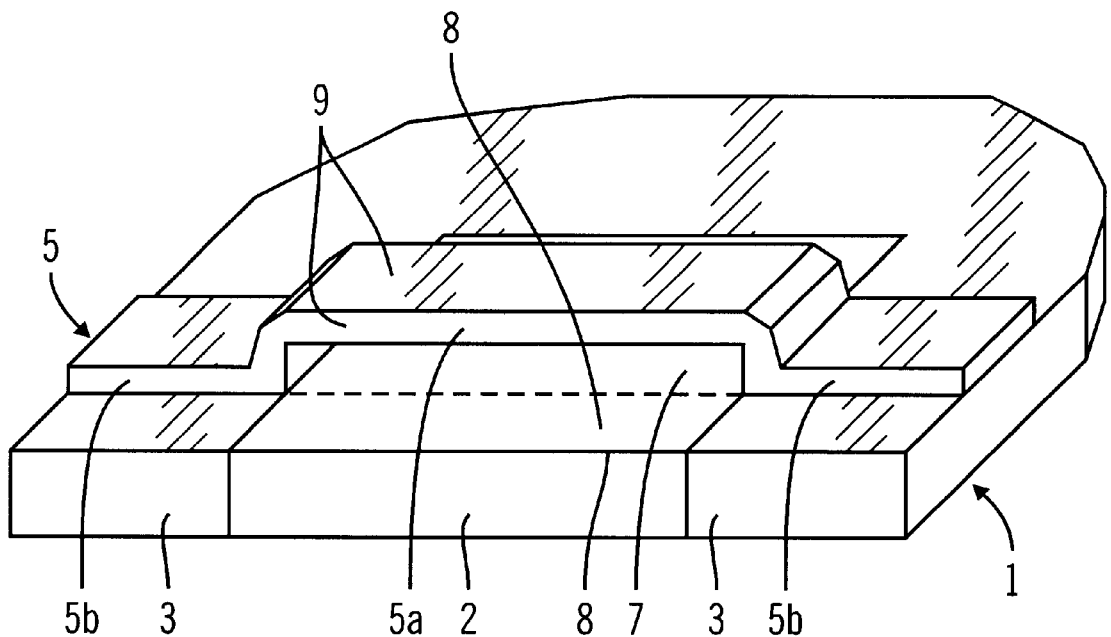

As illustrated in FIG. 1b, masking and etching of the silicon layer 5 and the SiGe alloy layer 4 are then carried out so as to form, on the main surface of the active central region 2 of the substrate 1, a stack 6 of SiGe alloy 4 and silicon 5 layers having two opposed side walls on the active central region 2 that reveal the SiGe alloy layer 4. As shown in FIG. 1c, the SiGe alloy layer 4 is then selectively etched in order to form a tunnel 7 (for example, by using the oxidizing solution described above). The height of the tunnel 7 corresponds to the thickness of the layer 4 and is comprised between 1 to 50 nm. A thin silicon oxide layer 8 is then formed (for example, by thermal oxidation) on the main surface of the active central region 2 and the internal surface of the tunnel 7, while avoiding a complete filling of the tunnel 7. This (thermal) oxidation step also results in the covering of the external surface and of the side walls of the bridge structure with a silicon oxide layer 9.

Figure 1D:
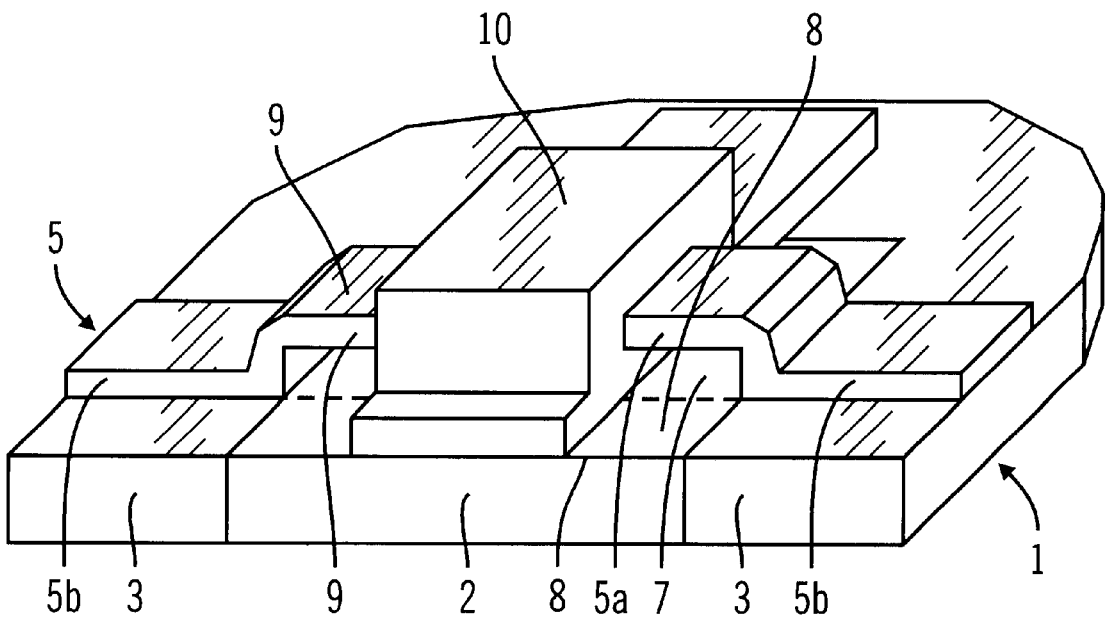
Figure 1E:
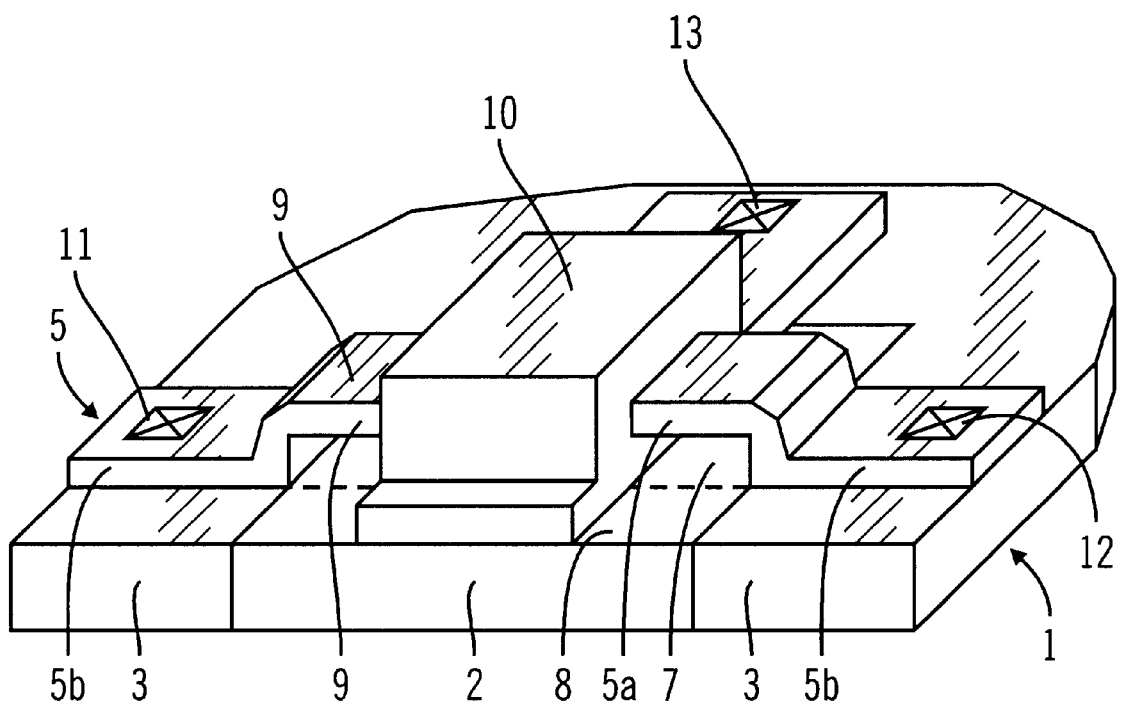

A polycrystalline silicon layer is then deposited in a conventional mainer so as to cover the entire main surface of the substrate 1 and fill the tunnel 7. This polycrystalline silicon layer is preferably doped in situ in a conventional manner. Next, as shown in FIG. 1d, the polycrystalline silicon layer is etched using conventional photolithographic etching techniques in order to form the gate 10 with a GAA architecture. As illustrated in FIG. 1e, the source and drain regions are then formed by ion implantation and equipped with a source contact 11 and a drain contact 12 in a conventional manner. The gate region is similarly equipped with a gate contact 13. The semiconductor device (e.g., transistor) is then completed in a conventional manner.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein.

Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for fabricating a semiconductor device having a gate-all-around architecture, said method comprising the steps of:

producing a substrate that includes an active central region of semiconductor material surrounded by an insulating peripheral region of dielectric material, the central region having an active main surface and the peripheral region having an insulating main surface, the active main surface and the insulating main surface being coextensive and constituting a main surface of the substrate;

forming a first layer on the active main surface, the first layer being a monocrystalline Ge or an SiGe alloy layer;

forming a silicon layer on the first layer and on the insulating main surface, said layer being monocrystalline in its central part formed on the first layer and polycrystalline in its parts formed on the insulating surface;

masking and etching the silicon layer and the first layer in order to form a stack on the active main surface, the stack having two opposed side walls that reveal the first monocrystalline layer;

removing the first layer so that the silicon layer of the stack forms a bridge structure over the active main surface, the bridge structure having side walls, an external surface, and an internal surface that defining a tunnel with a corresponding part of the active main surface;

forming a thin layer of a dielectric material that does not fill the tunnel on the external and internal surfaces of the bridge structure and on the side walls;

depositing a conducting material so as to cover the bridge structure and fill the tunnel; and masking and etching the conducting material in order to form a gate-all-around region for the semiconductor device.

2. The method as defined in claim 1,
wherein the step of forming the first layer uses selective epitaxy, and
the step of forming the silicon layer uses non-selective epitaxy.

3. The method as defined in claim 2, wherein the step of removing the first layer uses selective etching.

4. The method as defined in claim 1, farther comprising the step of doping the silicon layer before masking and etching the silicon layer and the first layer.

5. The method as defined in claim 4, wherein the doping is carried out in situ during formation of the silicon layer.

6. The method as defined in claim 4, wherein the doping is carried out by ion implantation after formation of the silicon layer.

7. The method as defined in claim 1, wherein the active central region of the substrate is silicon.

8. The method as defined in claim 1, wherein the conducting material is a metal.

9. The method as defined in claim 1, wherein the conducting material is polycrystalline silicon.

10. The method as defined in claim 1, wherein the semiconductor device is a transistor.

* * * * *